(12) United States Patent  
Su et al.

(10) Patent No.: US 7,687,352 B2  
(45) Date of Patent: Mar. 30, 2010

(54) TRENCH MOSFET AND METHOD OF MANUFACTURE UTILIZING FOUR MASKS

(75) Inventors: Shih Tzung Su, Shulin (TW); Jun Zeng, Torrance, CA (US); Poi Sun, Torrance, CA (US); Kao Way Tu, Jhonghe (TW); Tai Chiang Chen, TianJin (CN); Long Lv, TianJin (CN); Xin Wang, TianJin (CN)

(73) Assignee: Inpower Semiconductor Co., Ltd. (HK)

( * ) Notice: Subject to any disclaimer, the term of this patent is extended or adjusted under 35 U.S.C. 154(b) by 148 days.

(21) Appl. No.: 11/866,350

(22) Filed: Oct. 2, 2007

(65) Prior Publication Data

US 2009/0085074 A1 Apr. 2, 2009

(51) Int. Cl.
*H01L 21/336* (2006.01)
(52) U.S. Cl. .............................. 438/270; 257/E29.027
(58) Field of Classification Search .................. 438/212, 438/259, 268, 270–272, 589; 257/E29.027
See application file for complete search history.

(56) References Cited

U.S. PATENT DOCUMENTS

| | | | | |
|---|---|---|---|---|
| 5,604,137 A | * | 2/1997 | Yamazaki et al. | 438/153 |
| 2004/0191994 A1 | * | 9/2004 | Williams et al. | 438/270 |
| 2007/0042552 A1 | * | 2/2007 | Ma | 438/270 |
| 2007/0287275 A1 | * | 12/2007 | Adkisson et al. | 438/517 |
| 2008/0233693 A1 | * | 9/2008 | Lee et al. | 438/216 |

* cited by examiner

*Primary Examiner*—David Vu
(74) *Attorney, Agent, or Firm*—Hayes Soloway P.C.

(57) ABSTRACT

In accordance with the invention, a trench MOSFET semiconductor device is manufactured in accordance with a process comprising the steps of: providing a heavily doped N+ silicon substrate; utilizing a first mask to define openings for the trench gate and termination; utilizing a second mask as a source mask with openings determining the size and shape of a diffused source junction depth; utilizing a third mask as a contact mask to define contact hole openings; and utilizing a fourth mask as a metal mask, whereby only the first, second, third and fourth masks are utilized in the manufacture of the trench MOSFET semiconductor device.

20 Claims, 10 Drawing Sheets

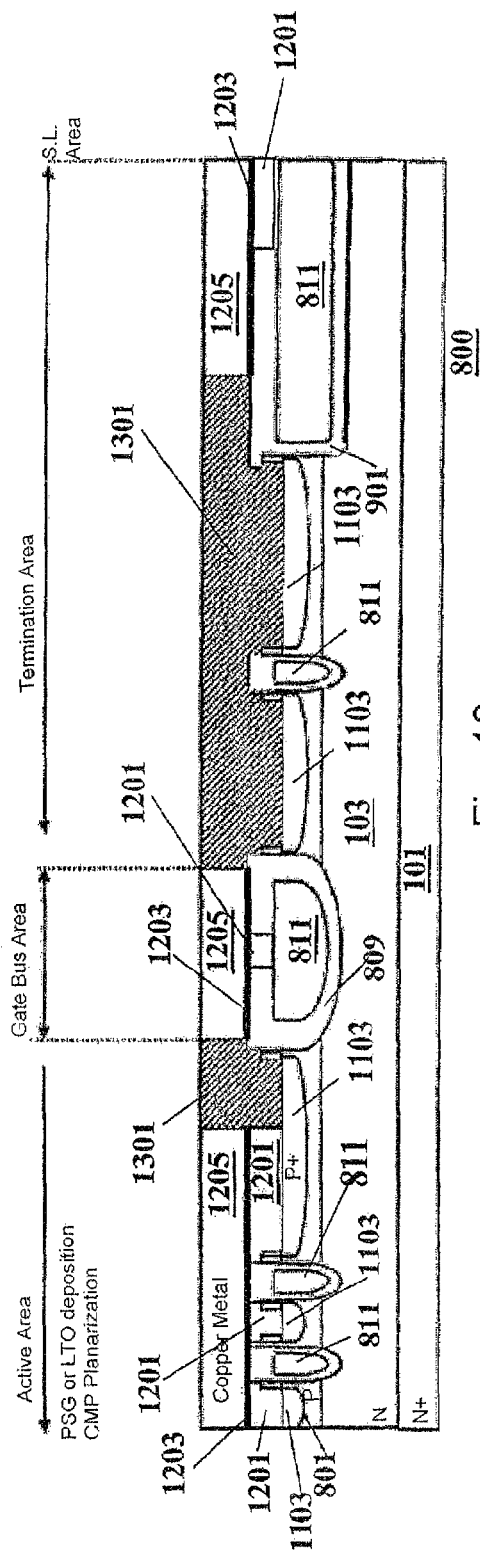
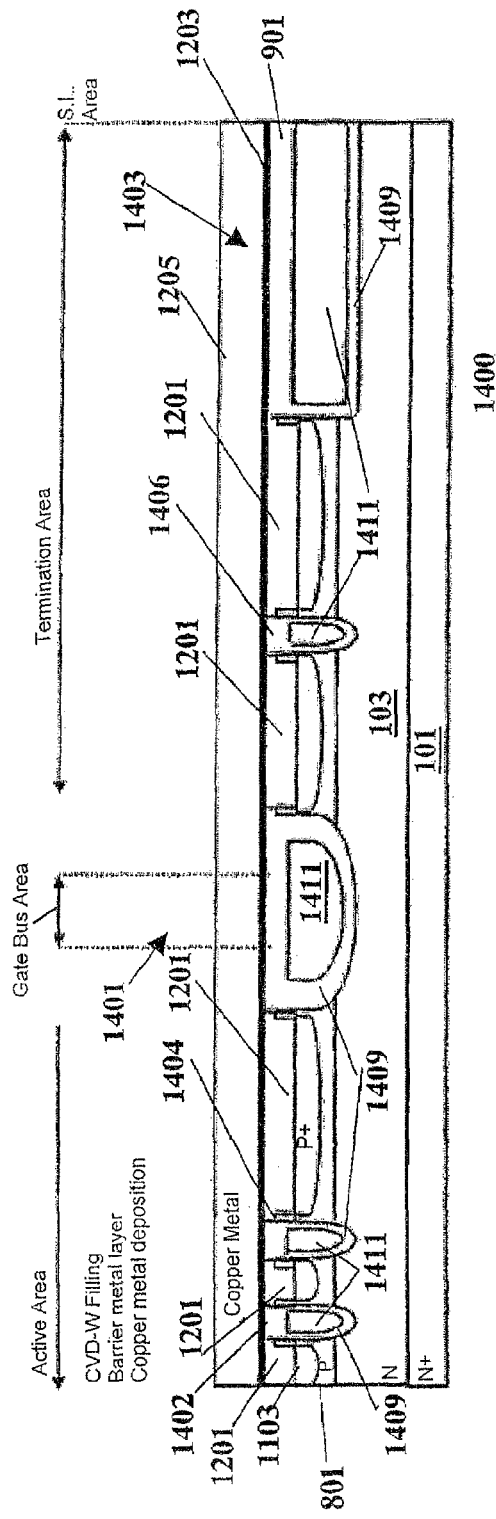
Fig. 13
Fig. 14

TRENCH MOSFET AND METHOD OF MANUFACTURE UTILIZING FOUR MASKS

FIELD OF THE INVENTION

This invention pertains to the manufacture of semiconductor devices, in general, and to the manufacture of semiconductor devices comprising trench power MOSFET (metal-oxide-semiconductor field effect transistor) devices, in particular.

Trench power MOSFET devices are used in many applications including power supplies, battery chargers, computers, and cell phones. The prior process to manufacture these devices typically utilizes six to eight masking layers. Because of the large quantity of wafers now manufactured, and the cost sensitive nature of the power MOS business, it is very desirable to simplify the process by reducing the number of masks.

A trench MOSFET is a transistor in which the channel is formed vertically and the gate is formed in a trench extending between the source and drain. The trench, which is lined with a thin insulator layer such as an oxide layer and filled with a conductor such as poly-silicon, allows less constricted current flow and thereby provides lower values of drain-source on-resistance $R_{dson}$.

One prior approach to reduce drain-source on-resistance $R_{dson}$ for a trench MOSFET is to increase the trench density, i.e., to increase the number of trenches per unit area. One way of increasing the number of trenches per unit area may be achieved by reducing the cell pitch. However, reducing cell pitch of MOSFETs is limited by the particulars of the MOSFET cell structure and the specific process, such as the alignment and the contact etch, used to manufacture the MOSFET.

Reducing cell pitch is made further difficult by limitations of the manufacturing process technology such as the minimum critical dimensions that the photolithography tools are configured to resolve, the minimum required spacing between different cell regions as dictated by the design rules, and the misalignment tolerances.

Accordingly, it is desirable to provide a structure and method for forming a trench MOSFET having an improved cell pitch and reduced manufacturing cost.

SUMMARY OF THE INVENTION

In accordance with the principles of the invention trench MOSFET structures are provided and methods are provided for forming such a trench MOSFET structure having an improved cell pitch and reduced manufacturing cost. The methods utilize a combination of chemical mechanical planarization ("CMP") and self-aligned spacer techniques. In a first embodiment of the invention, the number of masking layers is reduced to four, and critical alignment variation is significantly improved through self-alignment.

In accordance with one aspect of the invention, there is provided a method for manufacturing a trench MOSFET semiconductor device, comprising the steps of: providing a heavily doped N+ silicon substrate; utilizing a first mask to define openings for the trench gate and termination; utilizing a second mask as a source mask with openings determining the size and shape of a diffused source junction depth; utilizing a third mask as a contact mask to define contact hole openings; and utilizing a fourth mask as a metal mask, whereby only the first, second, third and fourth masks are utilized in the manufacture of the trench MOSFET semiconductor device.

In accordance with another aspect of the invention, there is provided a trench MOSFET semiconductor device which is manufactured by providing a heavily doped N+ silicon substrate; utilizing a first mask to define openings for the trench gate and termination; utilizing a second mask as a source mask with openings determining the size and shape of a diffused source junction depth; utilizing a third mask as a contact mask to define contact hole openings; and utilizing a fourth mask as a metal mask, whereby only the first, second, third and fourth masks are utilized in the manufacture of the trench MOSFET semiconductor device.

BRIEF DESCRIPTION OF THE DRAWINGS

The invention will be better understood from a reading of the following detailed description of various embodiments of the invention in conjunction with the drawing figures in which like reference designators are utilized to identify like elements, and in which:

FIGS. 8 through 13 are cross-sections of a trench MOSFET device at various process steps illustrating a second method of fabrication in accordance with the principles of the invention;

FIGS. 14 through 18 are cross-sections of a trench MOSFET device at various process steps illustrating a third method of fabrication in accordance with the principles of the invention;

DETAILED DESCRIPTION

A first trench MOSFET is manufactured utilizing four mask layers, tungsten plug contact fillings and CMP planarization to shrink the cell pitch and reduce manufacturing cost The first embodiment as shown in FIGS. 1 through 7, inclusive, illustrates the manufacture of a trench DMOS (Double-Diffused MOSFET) device 100 and a termination structure.

Figure 1:
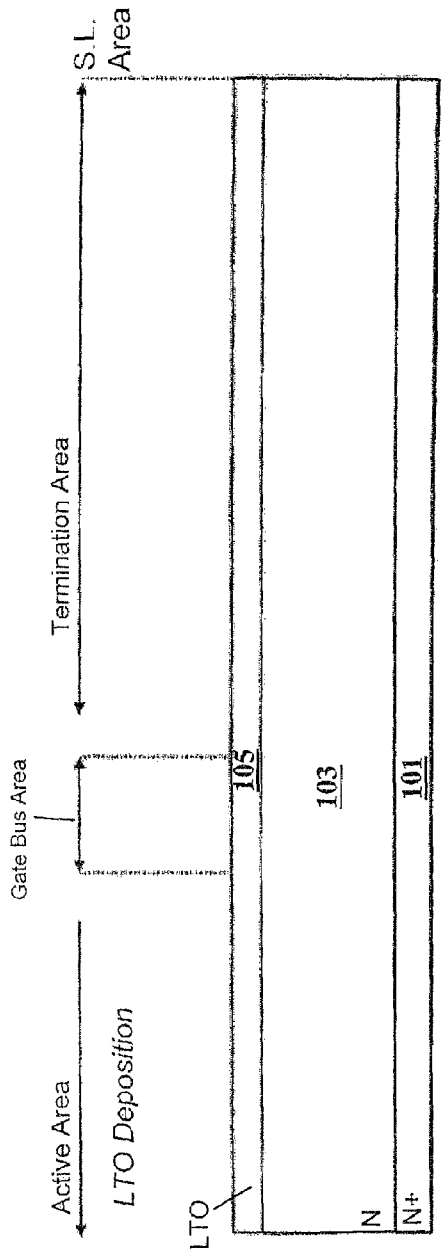
FIGS. 1 through 7 are cross-sections of a trench MOSFET device at various process steps illustrating a first method of fabrication in accordance with the principles of the invention.

Turning now to FIG. 1, an N type epitaxial layer 103 is formed on a heavily doped N+ substrate 101. A thick $SiO_2$ low temperature oxide (LTO) film 105 is formed by thermal oxidation.

Figure 2:
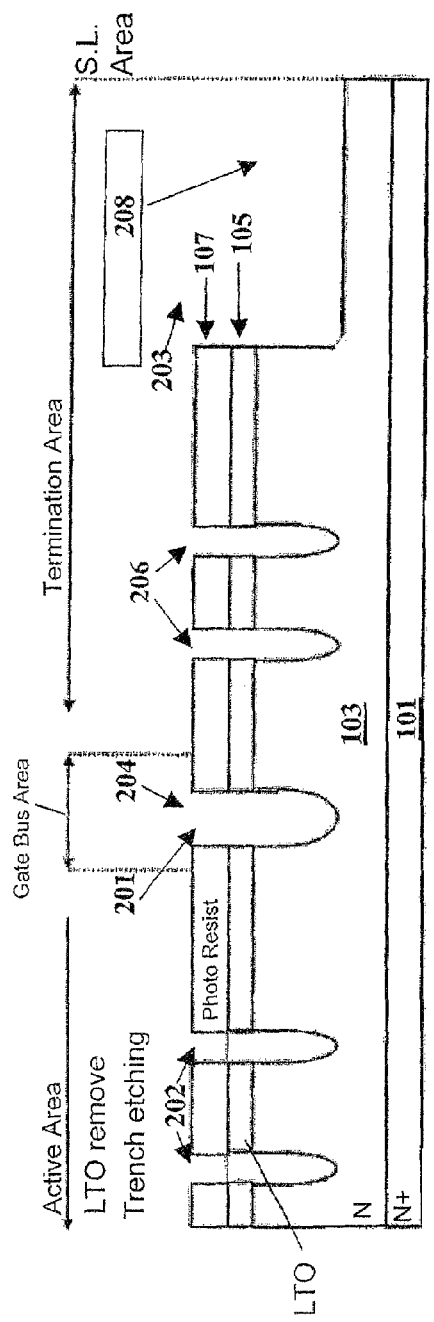

A trench mask 107, the first of the four masks, is deposited on LTO film 105 to define openings of the trench gate 201 and termination 203. Active region 200, trenches 202, gate bus trench 204, and termination trench 208 are then etched through the $SiO_2$ film 105 and into the Si substrate to a depth range of 0.8 to 1.8 um. FIG. 2 shows the structure after trench mask definition.

After a sacrificial oxidation and an oxide removal, a gate oxide layer 109 of a thickness ranging from 20 to 120 nm is thermally grown followed by thick Poly-Silicon refill layer 111. Poly-Silicon refill layer 111 is then etched back to recess below Si surface 301 to a depth of about 200 to 400 nm. A Poly mask is not needed to define the gate bus area 201. Poly-Silicon layer 111 in the big trench area 201 is used to deliver gate signal.

Figure 3:
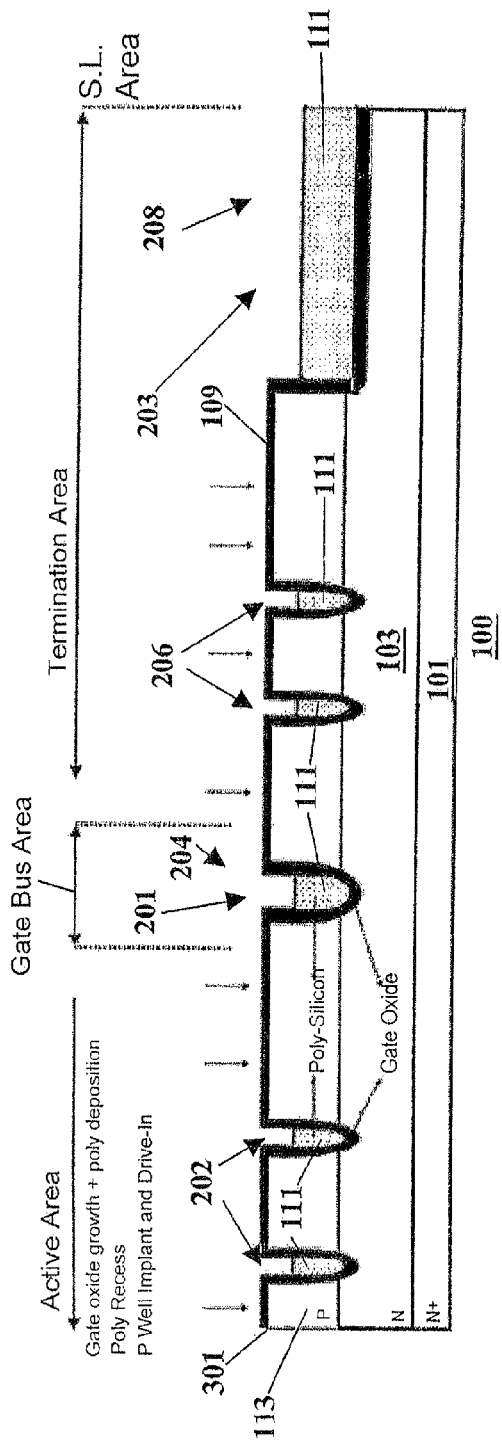

A P-body 113 is formed by B+ ion implantation through the substrate and is followed by a thermal diffusion resulting in the structure of FIG. 3.

Figure 4:
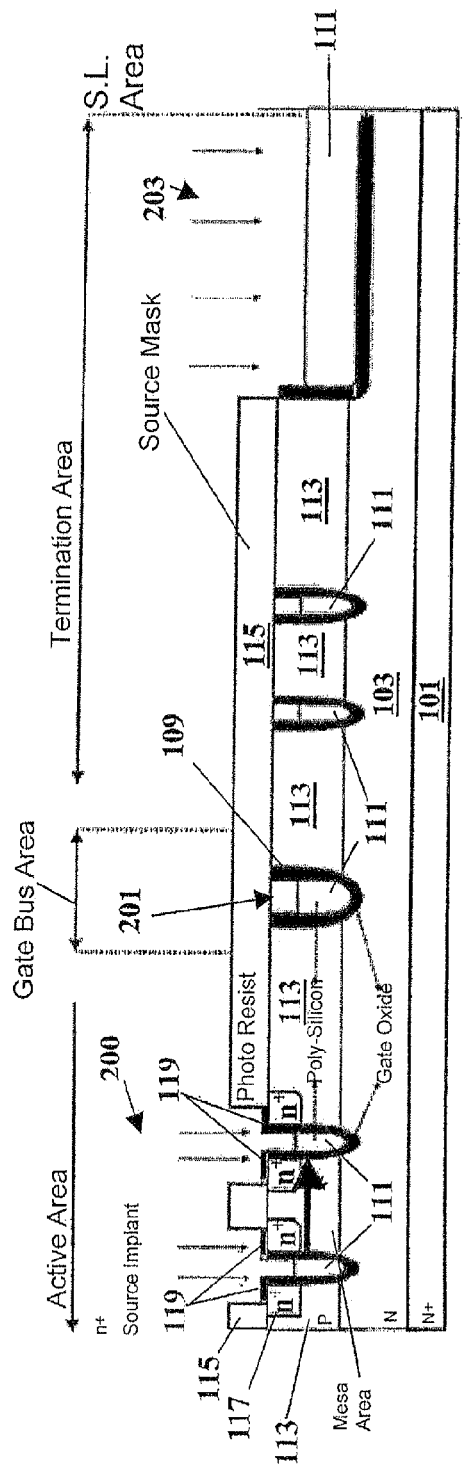

As shown in FIG. 4, a second mask 115 is then utilized as a source mask. Openings in mask 115 are etched to determine the size and shape of the diffused N+ source junction 117 depth.

Figure 5:
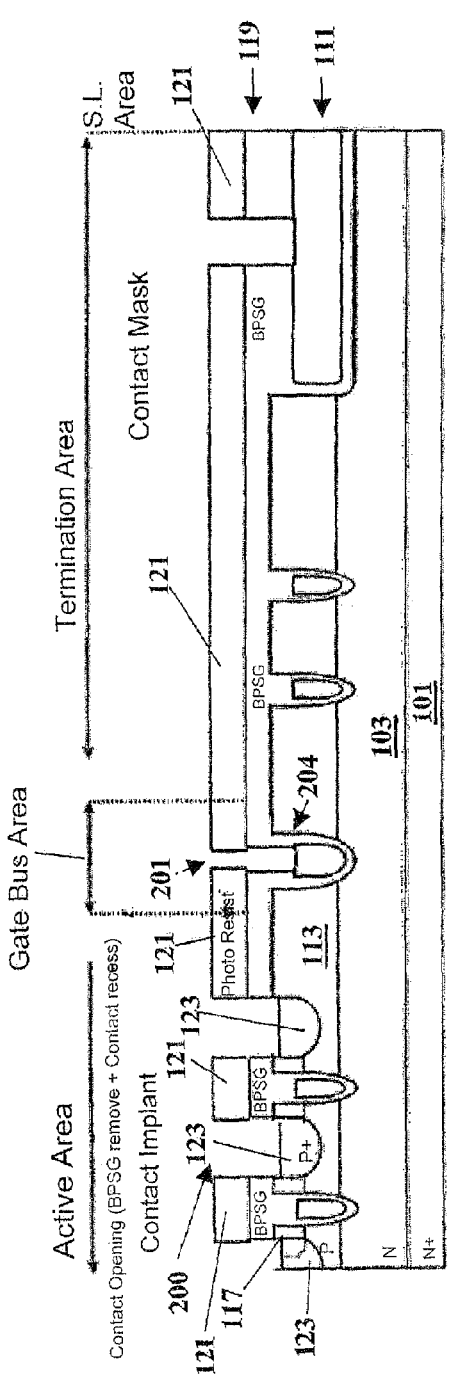
Figure 6:
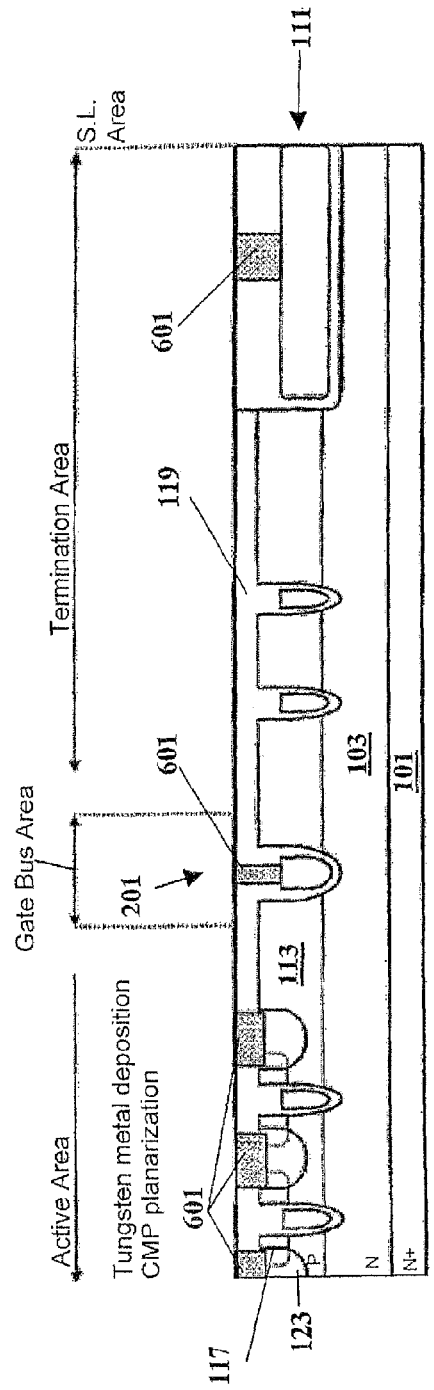
Figure 7:
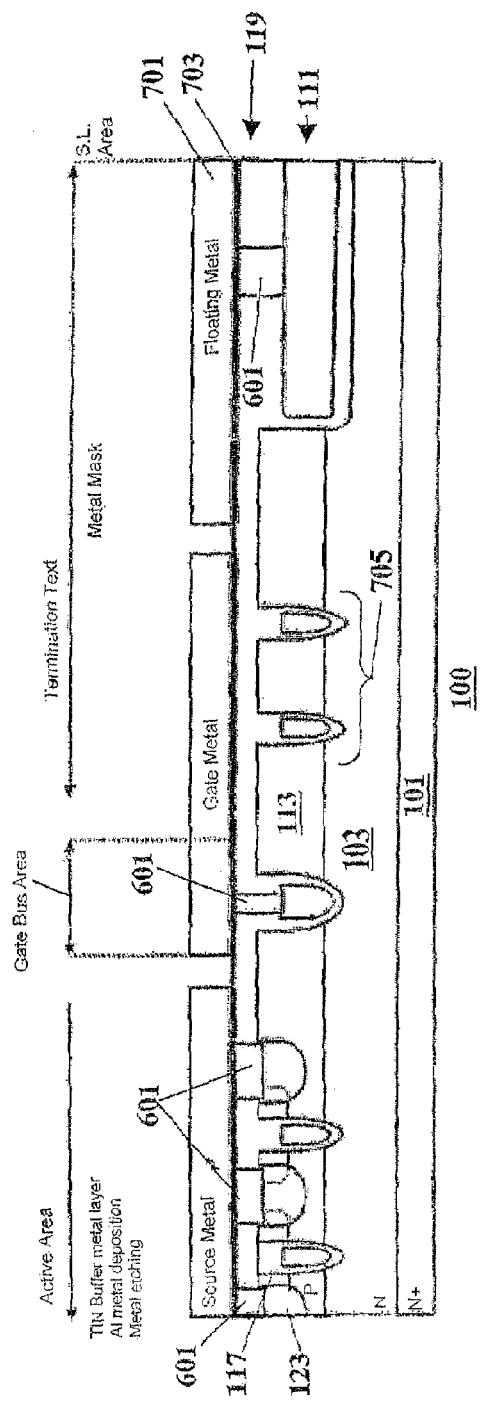

An oxide BPSG layer 119 is deposited to insulate poly-silicon layer 111 from a subsequent metal layer as shown in FIG. 5. Subsequently a contact mask 121 is deposited to define contact openings. A dry etch removes BPSG layer 119 in the contact openings. Contact implantation along with annealing by BPSG reflow is utilized to form P+ areas 123. Deeper etching is required for gate bus trench 204 and termination area trench 208 than in the active area trenches 202 to completely remove oxide resulting in a 50 to 100 nm contact recess in active cell area 200.

Due to contact opening size shrinkage, tungsten plugs 601 are used instead of Al metal to overcome step-coverage issues. Chemical Mechanical Polishing (CMP) is used to planarize tungsten plugs 601 producing the structure shown in FIG. 6.

A fourth, mask is used for metallization. An aluminum-based layer 701 that is 2 to 4 um thick is deposited on the whole wafer surface. In order to avoid chemical reactions between tungsten and the aluminum-based interconnection material layer 701, an addition TiN buffer layer 703 is first deposited. After depositing the final metal mask, etching is utilized to produce the structure 100 shown in FIG. 7.

A gate bus is used to conduct gate signals and to improve the switching speed and to lower the gate resistance of the device. The two floating trench structure 705 at termination 203 is used to spread the electrical potential distribution when device operates at breakdown to improve the reliability of the device.

To summarize, the process utilizing four masks includes the following steps:

1. Providing a heavily doped N+ silicon substrate;
2. Forming an N type epitaxial layer on the substrate;
3. Forming a thick SiO2-LTO film by thermal oxidation;
4. Providing a first mask to define the opening of the trench gate and termination;
5. Utilizing the first mask to etch though the SiO2 layer into the silicon substrate to define active region, gate bus and termination;
6. After oxide removal, thermally growing gate oxide;
7. Following the thermal grow with a thick Poly-Silicon refill;
8. Etching the filled Poly-Silicon to recess below the Silicon surface by a predetermined amount in the range of about 200 to 400 nm;
9. Forming a P-body by B+ ion implantation followed by a thermal diffusion;
10. Providing a second mask as a source mask with openings determining the size and shape of a diffused N+ source junction depth;
11. Depositing an oxide (BPSG) layer to insulate the poly-silicon layer;
12. Providing a contact mask to define contact hole openings;
13. Utilizing a dry etch to remove BPSG layer to provide contact recesses;
14. Forming P+ areas by implantation and annealed by BPSG reflow;
15. Depositing tungsten to provide plugs;
16. Utilizing Chemical Mechanical Polishing (CMP) to planarize the tungsten plugs;
17. Providing a fourth mask, as a metal mask;
18. Utilizing the fourth mask for depositing a TiN layer; and
19. Utilizing the fourth mask for depositing a thick aluminum based metal interconnection layer.

Vertical power MOSFETs require P+ body and N+ source diffusions to be shorted together to prevent second breakdown caused the by a parasitic bipolar transistor. For trench MOSFETs this has been achieved by using a metal layer on the top surface of the mesa to short the source diffusion and P+ body diffusion. In the past, one or more critical alignments have been used to make this possible. However, overlay requirements between layers limit the minimum mesa dimension. This, in turn, restricts on-resistance performance of lower voltage MOSFETs. Conventional trench MOSFETs uses several masks to produce the mesa structure. One prior approach is to pattern a source implant and align it to the trench pattern. A further mask is then needed to pattern the silicon contact.

In a second embodiment of the invention shown in FIGS. 8 through 13, inclusive, a new three mask layer process using a self-aligned contact is provided to form a trench MOSFET device 800. The three mask layer process helps to reduce the mesa dimension and to remove the critical alignments thereby increasing cell density and lowering on-resistance.

As in the first embodiment an N type epitaxial layer 103 is formed on a heavily doped N+ substrate 101. P-body and source area formations, 801, 803, respectively, are created by Boron and Arsenic or Phosphorus ion implantation without any masks through whole wafer. A proper thermal annealing is performed after implantations.

A first mask, a trench mask is utilized to define the opening of the trench gate 201 and termination 203.

Figure 8:
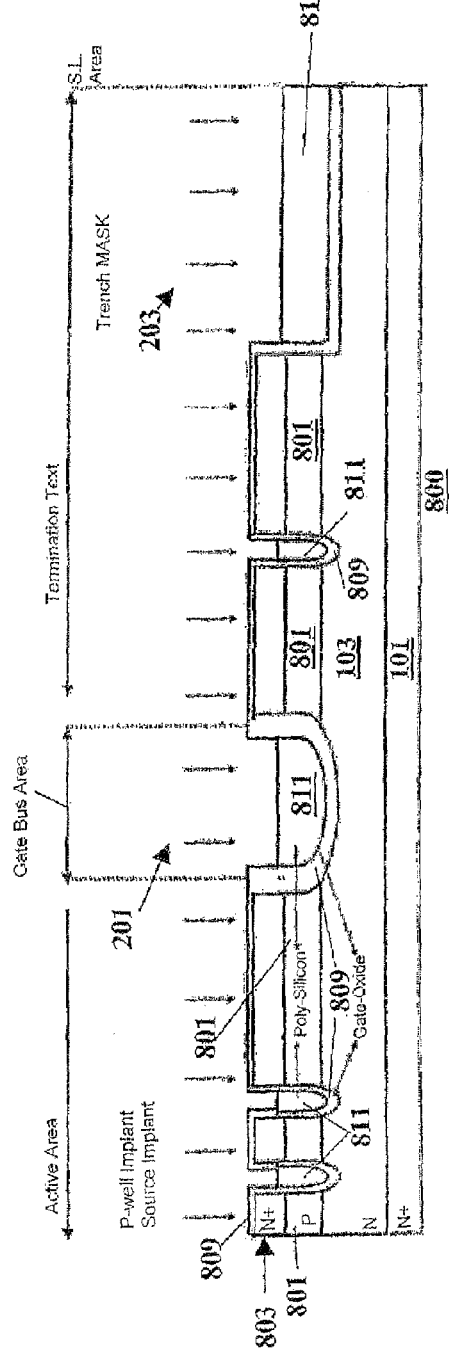
Figure 9:
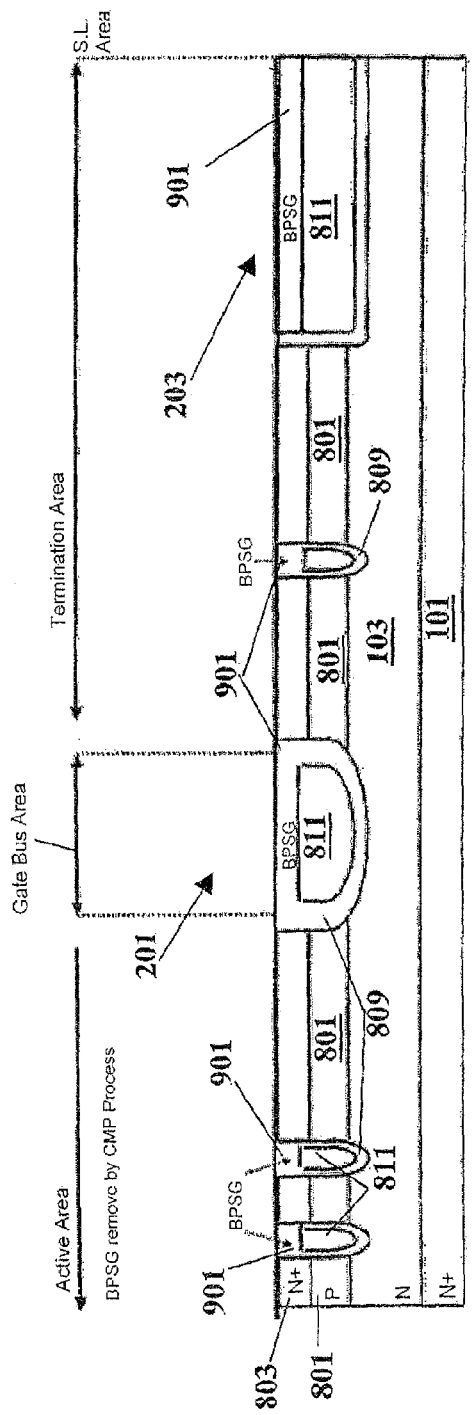

After a sacrificial oxidation and an oxide removal, a gate oxide layer 809 is thermally grown followed by thick Poly-Silicon refill layer 811. A mask is not used, nor is a mask needed, to define the gate bus area 201. The resulting structure is shown in FIG. 8.

A dielectric BPSG layer 901 is deposited on the surface of the wafer. A CMP process is used to planarize the upper surface of the body region and the upper surface of the dielectric layer 901 within the trench to produce the structure shown in FIG. 9.

Figure 10:
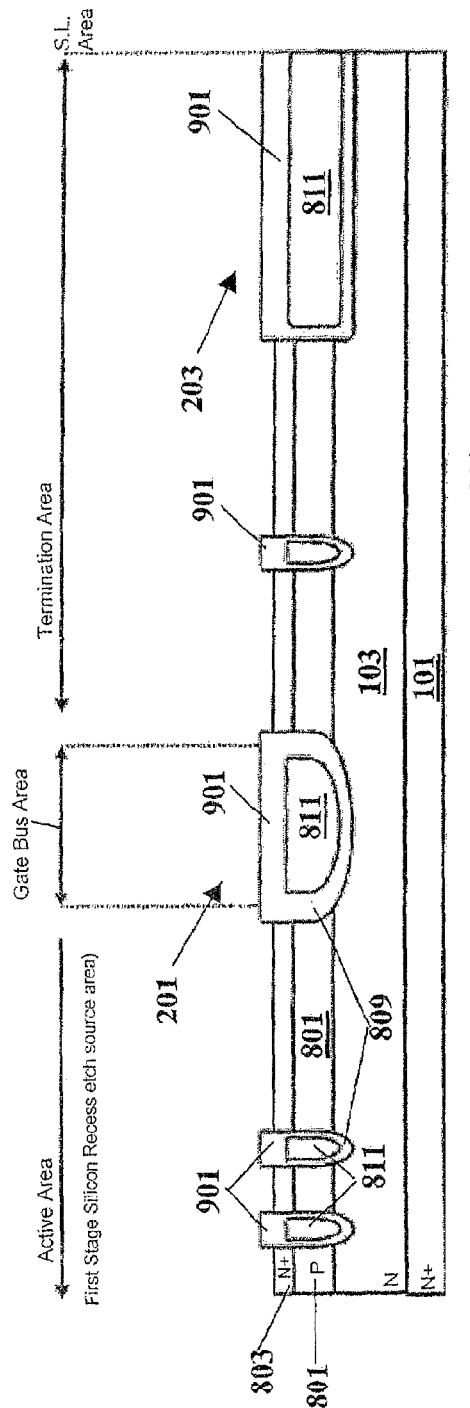
Figure 11:
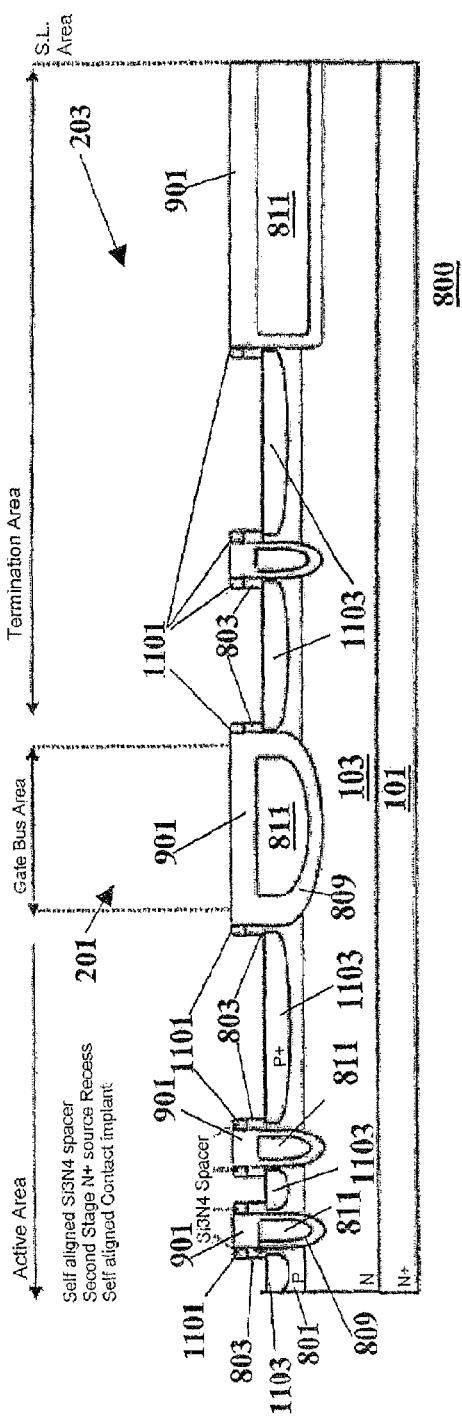
Figure 12:
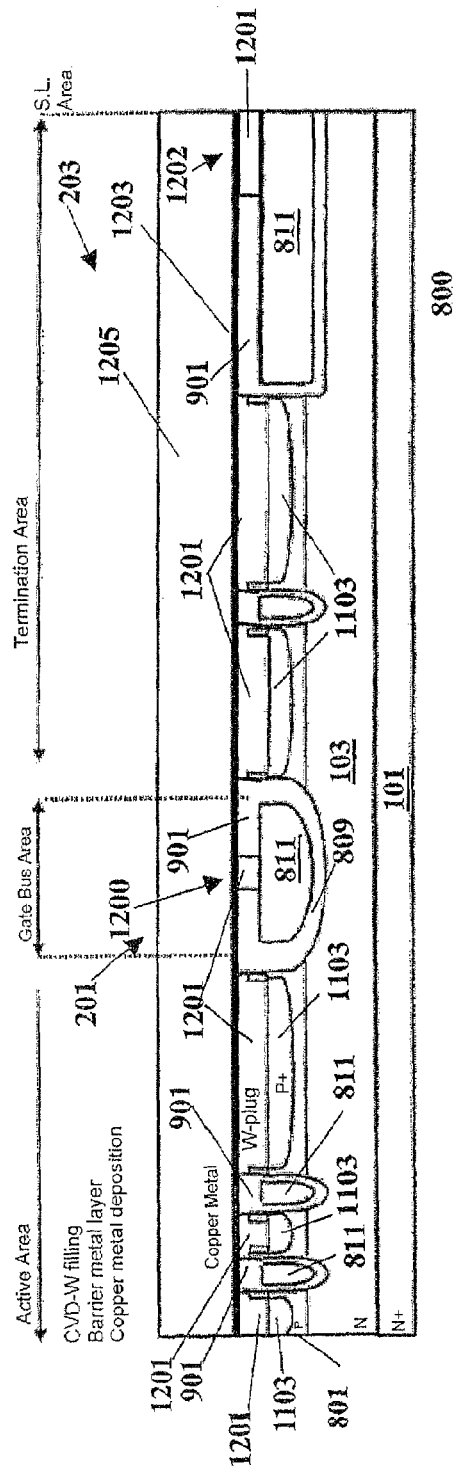

An etch step is utilized with the result that the N+ source portions 803 laterally adjacent dielectric layer 901 are recessed so that portions of the dielectric layer 901 extends outwardly above the surface of the silicon within a range of about 0.1~1 um as shown in FIG. 10.

A thick silicon nitride layer is deposited and is sequentially etched back by reactive ion etching (RIE) to form sidewall spacers 1101. By employing the nitride sidewall spacers 1101, the exposed N+ source portions 803 are further recess etched by RIE producing the structure shown in FIG. 11.

P+ areas 1103 are formed by ion implantation, e.g., with B+ or BF2, followed by removal of nitride sidewall spacers 1101.

After removal of nitride spacers 1101, a second mask, a contact mask, is used to define a gate bus area contact area 1200 and a termination contact area 1202.

Tungsten is deposited utilizing CVD to plug and fill the narrow contacts and vias 1201 followed by CMP planarization so as to prevent metal step-coverage problems and to eliminate dielectric voiding over the contacts and vias 1201.

A thin TiN layer 1203 is deposited. A thick Cu-based metal layer 1205 is deposited on TiN layer 1203 to produce the structure shown in FIG. 12.

A third or metal mask is employed to separate the source metal and the gate bus metal and also remove the termination metal film.

A thick PSG (phosphosilicate glass) oxide 1301 is deposited as an insulation layer, followed by the CMP planarization to isolate the source metal and gate metal.

The final device structure 1300 is shown in FIG. 13. This new process technique can be employed to fabricate very high cell density trench gate power MOSFET that without photolithography limitations.

To summarize, the process utilizing three masks includes the following steps:

1. Providing a heavily doped N+ silicon substrate 101;
2. Forming an N type epitaxial layer 103 on the substrate;
3. Forming a thick SiO2-LTO film or layer 105 by thermal oxidation;
4. Creating p-body 801 and source area 803 formations by Boron and Arsenic or Phosphorus ion implantation without any masks;
5. Performing thermal annealing after implantations;
6. Utilizing a first mask (Trench mask) to define openings for the trench gate 201 and a termination 203;
7. Thermally growing a gate oxide layer 809 followed by formation of a thick Poly-Silicon refill layer 811. A mask is not used, nor is a mask needed, to define the gate bus area 201.
8. Depositing a dielectric layer 901;
9. Planarizing the upper surface of the structure;
10. Etching the upper surface such that N+ source portions 803 laterally adjacent dielectric layer 901 are recessed and that portions of dielectric layer 901 extends outwardly above the surface of the silicon as shown in FIG. 10;
11. Depositing a thick silicon nitride layer 1101;
12. Sequentially etching back the silicon nitride layer 1101 by reactive ion etching (RIE) to form sidewall spacers and also further recessing exposed N+ source regions 803 producing the structure shown in FIG. 11;
13. Forming P+ areas 1103 using ion implantation;
14. Removing nitride sidewall spacers 1101;
15. Providing a second or contact mask to define a gate bus area contact area 1200 and a termination contact area 1202;
16. Utilizing CVD to deposit tungsten to fill contacts and vias 1201 and planarize the deposited tungsten utilizing Chemical Mechanical Polishing (CMP);
17. Depositing a thin TiN layer 1203;
18. Depositing a thick copper based metal film 1205;
19. Utilizing a third metal mask to separate the source metal and the gate bus metal and remove the termination's metal film;
19. Depositing a thick PSG oxide 1301 as an insulation layer; and
20. Utilizing CMP planarization to isolate the source metal and gate metal.

Figure 19:
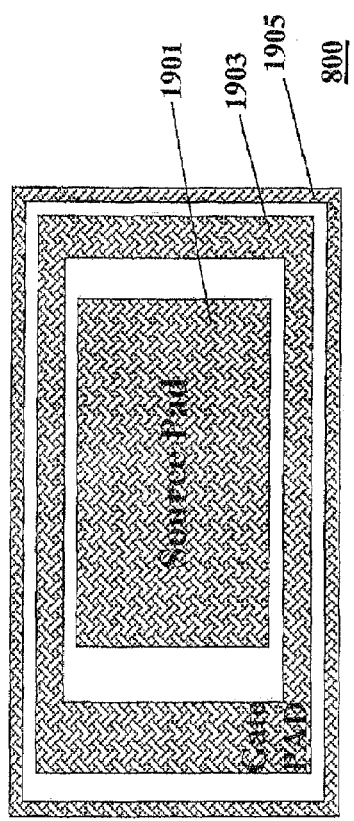
FIG. 19 is a top planar view of the trench MOSFET device of FIGS. 8 through 13.

The trench MOSFET device 800 produced utilizing the three mask process is shown in top planar view in FIG. 19. The resulting device includes a source pad metallized area 1901, a gate pad metallized area 1903 and a termination metallized area 1905.

A third advanced process for fabricating a trench MOSFET 1400 utilizes only two mask layers, one for providing trenches and one for providing contacts, are shown in FIGS. 14 through 18.

Figure 15:
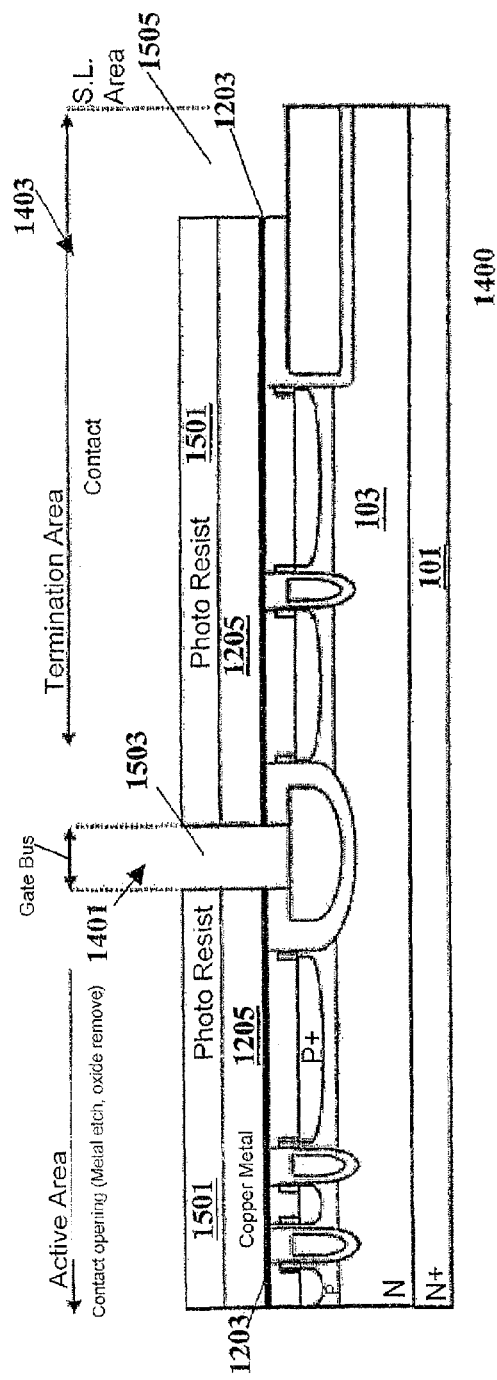
Figure 16:
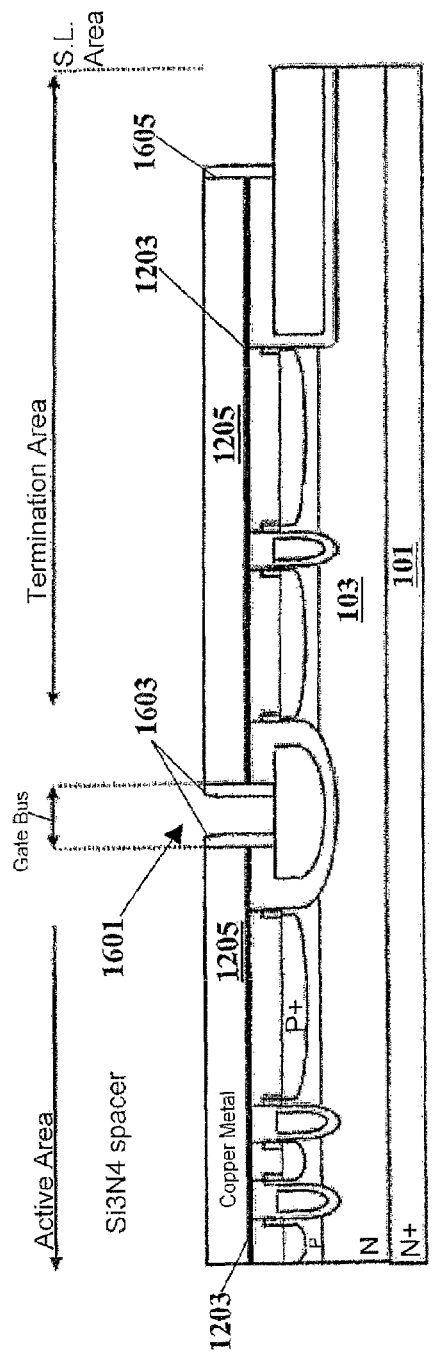

In contrast to the three mask embodiment described above, the metal mask is eliminated. Its main process steps are: (a) contact hole opening and dry etching metal and oxide films as shown in FIG. 14 and FIG. 15; (b) Nitride spacer formation by deposition and reactive ion etching (RIE) of nitride as shown in FIG. 16; (c) A thick copper metal layer filling followed by planarization of the top surface to a specific plane by utilizing CMP to isolate the source metal and gate metal.

As in the three mask embodiment an N type epitaxial layer 103 is formed on a heavily doped N+ substrate 101.

Gate and termination area formations, 1401, 1403, respectively, are created by Boron and Arsenic or Phosphorus ion implantation without any masks. Thermal annealing is performed after implantations.

A first mask, a trench mask is utilized to define the opening of trench gate 1401, termination 1403 and trenches 1402, 1404, 1406.

After a sacrificial oxidation and an oxide removal, gate oxide layer 1409 is thermally grown followed by thick Poly-Silicon refill layer 1411.

A dielectric BPSG layer 1201 is deposited on the surface of the wafer. A CMP process is used to planarize the upper surface of the body region and the upper surface of the dielectric layer 1201 within the trench gate 1401, termination 1403 and trenches 1402, 1404, 1406.

An etch step is utilized with the result that the N+ source areas 803 laterally adjacent dielectric layer 1201 are recessed so that portions of the dielectric layer 1201 extends outwardly above the surface of the silicon within a range of about 0.1~1 um as shown in FIG. 14.

A thick silicon nitride layer 1101 is deposited and is sequentially etched back by reactive ion etching (RIE) to form sidewall spacers. By employing the nitride sidewall spacers 1101, the exposed N+ source region 803 are further recess etched by RIE.

Before removing nitride sidewall spacers, P+ areas 1103 are formed by B+ or BF2 ion implantation.

Tungsten 1201 is deposited utilizing CVD to fill the narrow contacts and vias so as to prevent metal step-coverage problems and to eliminate dielectric voiding.

A thin barrier metal TiN layer 1203 is deposited followed by a thick copper based metal layer 1205 deposited on TiN layer 1203 as shown in FIG. 14.

A contact photo resist mask 1501, as shown in FIG. 15 is employed to provide openings 1503, 1505 that separate the source metal and the gate bus metal and also remove a portion of termination metal.

A thick silicon nitride layer 1603 is deposited and is sequentially etched back by reactive ion etching (RIE) to form sidewall spacers 1601 as shown in FIG. 16.

Figure 17:
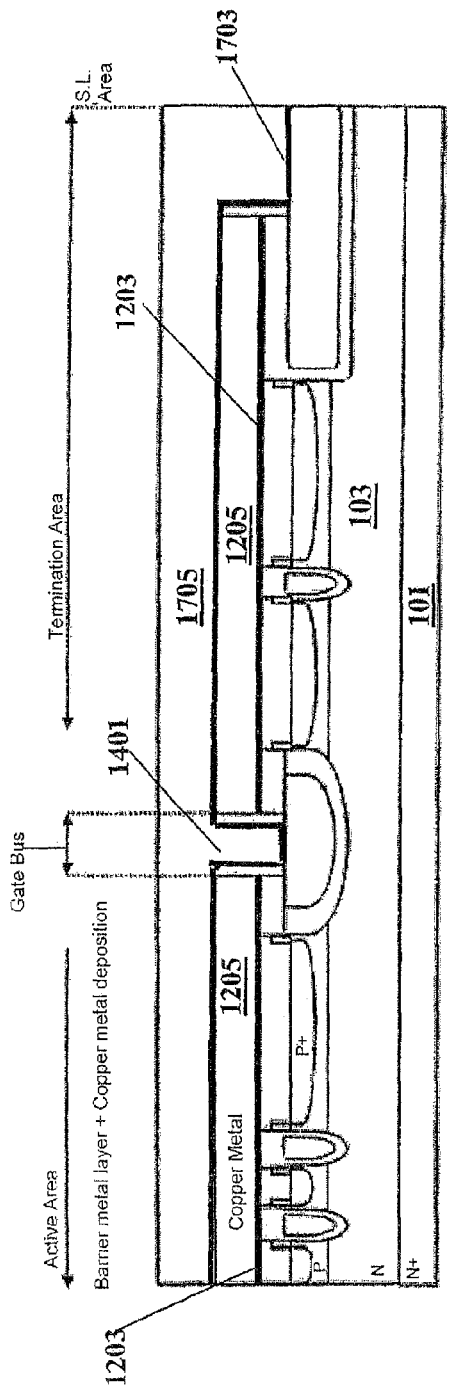

A thin barrier metal layer 1703 and thick Cu-based metal film 1705 are deposited on thin barrier metal layer 1703 as shown in FIG. 17.

Figure 18:
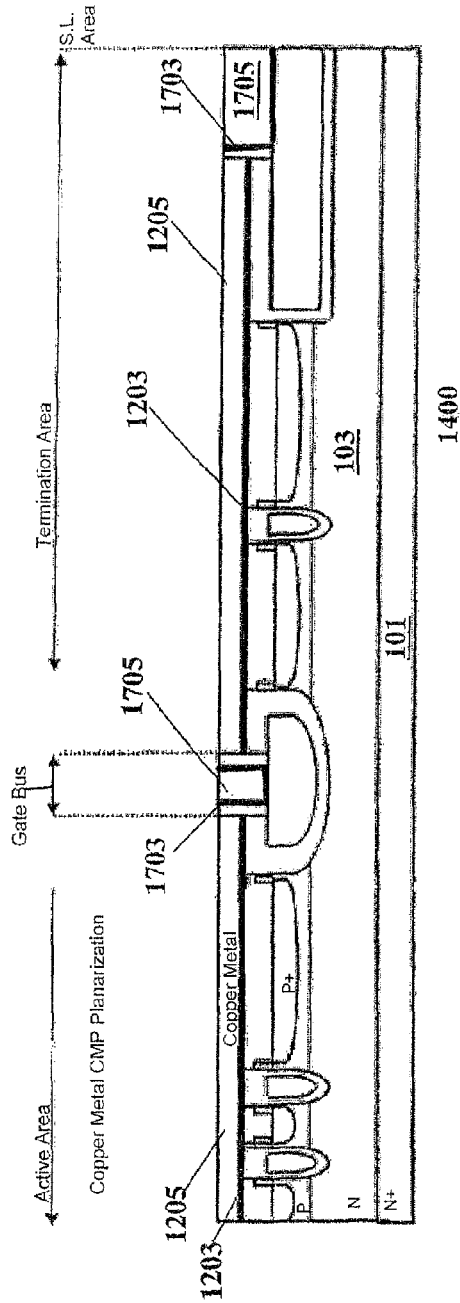

A CMP planarization step of the copper based metal layer 1705 produces the final structure as shown in FIG. 18.

To summarize, the process utilizing three masks includes the following steps:

1. Providing a heavily doped N+ silicon substrate 101;
2. Forming an N type epitaxial layer 103 on the substrate;
3. Forming a thick SiO2-LTO film or layer 105 by thermal oxidation;
4. Creating p-body 801 and source area 803 formations by Boron and Arsenic or Phosphorus ion implantation without any masks;
5. Performing thermal annealing after implantations;
6. Utilizing a first mask (Trench mask) to define openings for the trench gate 1401 and a termination 1403;
7. Thermally growing a gate oxide layer 1409 followed by formation of a thick Poly-Silicon refill layer 1411. A mask is not used, nor is a mask needed, to define the gate bus area 1401;
8. Depositing a dielectric layer 901;
9. Planarizing the upper surface of the structure;
10. Etching the upper surface such that N+ source portions 803 laterally adjacent dielectric layer 901 are recessed and that portions of dielectric layer 901 extends outwardly above the surface of the silicon as shown in FIG. 10;

11. Depositing a thick silicon nitride layer 1101;
12. Sequentially etching back the silicon nitride layer 1101 by reactive ion etching (RIE) to form sidewall spacers and also further recessing exposed N+ source regions 803 producing the structure shown in FIG. 11;
13. Forming P+ areas 1103 using ion implantation;
14. Removing nitride sidewall spacers 1101;
15. Utilizing CVD to deposit tungsten to fill contacts and vias 1201;
17. Depositing a thin barrier metal TiN layer 1203;
18. Depositing a thick copper based metal film 1205;
19. Utilizing a second metal mask to open a gate bus area and remove a portion of the termination metal;
20. Forming nitride spacers by deposition and reactive ion etching (RIE) of nitride;
21. Depositing a thin barrier metal layer 1703 of TiN;
22. Depositing a copper metallization layer 1705; and
23. Utilizing CMP planarization to isolate the source metal, gate metal, and termination metal.

Figure 21:
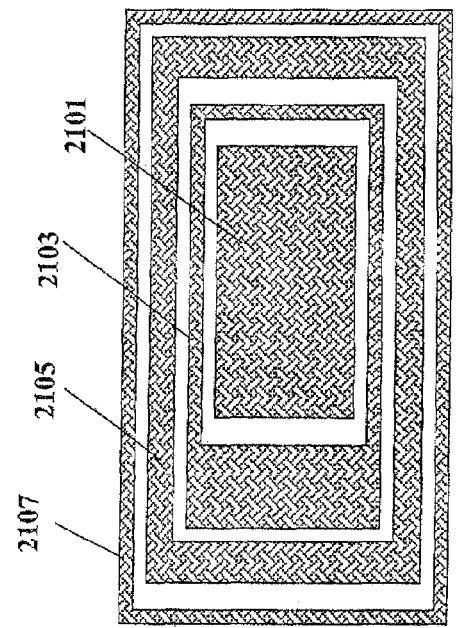
FIG. 21 is a top planar view of the trench MOSFET device of FIGS. 14 through 18
Figure 20:
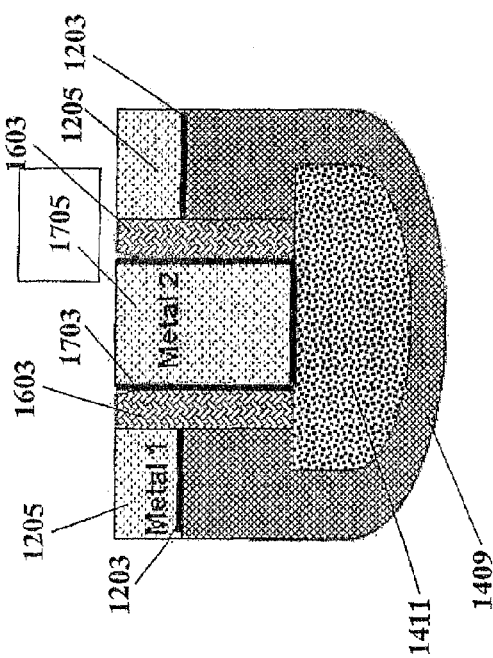
FIG. 20 is expanded view of the gate bus area of the trench MOSFET device shown in FIG. 18.

FIG. 20 shows gate bus area of FIG. 18 in greater detail. Of particular note is that as a result of the steps of depositing a first barrier metal layer 1203 and a first thick metallization layer 1205, forming nitride sidewalls 1603, second barrier metal layer 1703 and second metallization layer 1705, the trench MOSFET structure 1400 shown in FIG. 21 is produced. Viewed from the top, the resulting structure includes a source pad 2101, gate pad 2103, and termination pads 2105, 2107.

The invention has been described in terms of several embodiments. It is not intended that the invention is limited by the embodiments shown and described. It is intended that the invention be limited only by the scope of the claims appended hereto with such claims being given the broadest scope permissible in view of prior art and the law. It will be appreciated by those skilled in the art that various changes and modifications may be made without departing from the spirit or scope of the invention.

What is claimed is:

1. A method for manufacturing a trench MOSFET semiconductor device, comprising the steps of:
   providing a heavily doped N+ silicon substrate;
   utilizing a first mask to define openings for the trench gate and termination;
   utilizing a second mask as a source mask with openings determining the size and shape of a diffused source junction depth;
   utilizing a third mask as a contact mask to define contact hole openings; and
   utilizing a fourth mask as a metal mask, whereby only said first, second, third and fourth masks are utilized in the manufacture of said trench MOSFET semiconductor device.

2. A method in accordance with claim 1, comprising:
   forming an N type epitaxial layer on said substrate;
   forming a thick $SiO_2$-LTO film by thermal oxidation;
   utilizing the first mask to etch though the $SiO_2$ layer into said silicon substrate to define an active region, a gate bus and a termination.

3. A method in accordance with claim 2, comprising:
   between said first and said second mask steps, performing the following steps:
   thermally growing gate oxide;
   following said thermal growing step, providing a thick Poly-Silicon refill;
   etching said Poly-Silicon to recess below the surface of said substrate by a predetermined amount; and
   subsequent to said etching step, forming a P-body by B+ ion implantation followed by a thermal diffusion.

4. A method in accordance with claim 3, comprising:
   between said second and said third mask steps, performing the following step:
   depositing an oxide (BPSG) layer to insulate said poly-silicon layer.

5. A method in accordance with claim 4, comprising:
   performing the following steps between said third and said fourth mask steps:
   utilizing a dry etch to selectively remove said BPSG layer to provide contact recesses;
   forming P+ areas by implantation and annealing;
   depositing tungsten to provide contact plugs; and
   utilizing Chemical Mechanical Polishing (CMP) to planarize said tungsten plugs.

6. A method in accordance with claim 5, comprising:
   utilizing said fourth mask for depositing a TiN layer; and
   utilizing said fourth mask for depositing a thick aluminum based metal interconnection layer.

7. A method in accordance with claim 1, comprising:
   between said first and said second mask steps, performing the following steps:
   thermally growing gate oxide;
   following said thermal growing step, providing a thick Poly-Silicon refill;
   etching said Poly-Silicon to recess below the surface of said substrate by a predetermined amount; and
   subsequent to said etching step, forming a P-body by B+ ion implantation followed by a thermal diffusion.

8. A method in accordance with claim 1, comprising:
   performing the following step between said second and said third mask steps:
   depositing an oxide (BPSG) layer to insulate said poly-silicon layer.

9. A method in accordance with claim 1, comprising:
   performing the following steps between said third and said fourth mask steps:
   utilizing a dry etch to selectively remove said BPSG layer to provide contact recesses;
   forming P+ areas by implantation and annealing;
   depositing tungsten to provide contact plugs; and
   utilizing Chemical Mechanical Polishing (CMP) to planarize said tungsten plugs.

10. A method in accordance with claim 1, comprising:
    utilizing said fourth mask for depositing a TiN layer; and
    utilizing said fourth mask for depositing a thick aluminum based metal interconnection layer.

11. A trench MOSFET semiconductor device, manufactured in accordance with a process comprising the steps of:
    providing a heavily doped N+ silicon substrate;
    utilizing a first mask to define the opening of the trench gate and termination;
    utilizing a second mask as a source mask with openings determining the size and shape of a diffused source junction depth;
    utilizing a third mask as a contact mask to define contact hole openings; and
    utilizing a fourth mask as a metal mask, whereby only said first, second, third and fourth masks are utilized in the manufacture of said trench MOSFET semiconductor device.

12. A trench MOSFET semiconductor device in accordance with claim 11, wherein said process comprises:

performing the following steps before said first mask step:
forming an N type epitaxial layer on said substrate;
forming a thick SiO$_2$-LTO film by thermal oxidation;
utilizing the first mask to etch though the SiO$_2$ layer into said silicon substrate to define an active region, a gate bus and a termination.

13. A trench MOSFET semiconductor device in accordance with claim 11, wherein said process comprises:
performing the following steps between said first and said second mask steps:
thermally growing gate oxide;
following said thermal growing step, providing a thick Poly-Silicon refill;
etching said Poly-Silicon to recess below the surface of said substrate by a predetermined amount; and
subsequent to said etching step, forming a P-body by B+ ion implantation followed by a thermal diffusion.

14. A trench MOSFET semiconductor device in accordance with claim 11, wherein said process comprises the steps of:
performing the following step between said second and said third mask steps:
depositing an oxide (BPSG) layer to insulate said polysilicon layer.

15. A trench MOSFET semiconductor device in accordance with claim 11, wherein said process comprises the steps of:
performing the following steps between said third and said fourth mask steps:
utilizing a dry etch to selectively remove said BPSG layer to provide contact recesses;
forming P+ areas by implantation and annealing;
depositing tungsten to provide contact plugs; and
utilizing Chemical Mechanical Polishing (CMP) to planarize said tungsten plugs.

16. A method for manufacturing a trench MOSFET semiconductor device, comprising the steps of:
providing a heavily doped N+ silicon substrate having a thick SiO$_2$ layer;
utilizing a first mask to etch though the SiO$_2$ layer into said silicon substrate to define an active region, a gate bus and a termination;
utilizing a second mask as a source mask with openings determining the size and shape of a diffused source junction depth;
utilizing a third mask as a contact mask to define contact hole openings; and
utilizing a fourth mask as a metal mask, whereby only said first, second, third and fourth masks are utilized in the manufacture of said trench MOSFET semiconductor device.

17. A method for manufacturing a trench MOSFET semiconductor device in accordance with claim 16, comprising the steps of:
thermally growing gate oxide after said utilizing said first mask;
following said thermal growing step, providing a thick Poly-Silicon refill;
etching said Poly-Silicon to recess below the surface of said substrate by a predetermined amount; and
subsequent to said etching step, forming a P-body by B+ ion implantation followed by a thermal diffusion.

18. A method for manufacturing a trench MOSFET semiconductor device in accordance with claim 16, comprising the steps of:
depositing an oxide (BPSG) layer to insulate said polysilicon layer between said second and said third mask steps.

19. A method for manufacturing a trench MOSFET semiconductor device in accordance with claim 18, comprising the steps of:
performing the following steps between said third and said fourth mask steps:
utilizing a dry etch to selectively remove said BPSG layer to provide contact recesses;
forming P+ areas by implantation and annealing; and
depositing tungsten to provide contact plugs.

20. A method for manufacturing a trench MOSFET semiconductor device in accordance with claim 19, comprising the steps of:
utilizing said fourth mask for depositing a first metal layer; and
utilizing said fourth mask for depositing a thick metal interconnection layer.

* * * * *